United States Patent
Chidambarrao et al.

(10) Patent No.: US 7,223,994 B2
(45) Date of Patent: May 29, 2007

(54) STRAINED SI ON MULTIPLE MATERIALS FOR BULK OR SOI SUBSTRATES

(75) Inventors: Dureseti Chidambarrao, Weston, CT (US); Omer H. Dokumaci, Wappingers Falls, NY (US); Oleg G. Gluschenkov, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/859,736

(22) Filed: Jun. 3, 2004

(65) Prior Publication Data

US 2005/0269561 A1    Dec. 8, 2005

(51) Int. Cl.
    H01L 29/06 (2006.01)
    H01L 31/072 (2006.01)
    H01L 31/109 (2006.01)
    H01L 31/0328 (2006.01)
    H01L 21/0336 (2006.01)

(52) U.S. Cl. .......................................... 257/18; 257/19
(58) Field of Classification Search ............ 257/18–20, 257/103, 190–194, 350–354
    See application file for complete search history.

(56) References Cited

U.S. PATENT DOCUMENTS

| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |
| 5,081,513 A | 1/1992 | Jackson et al. |

(Continued)

FOREIGN PATENT DOCUMENTS

JP    64-76755    3/1989

OTHER PUBLICATIONS

Jeffrey A. Davis, et al., "Interconnect Limits on Gigascale Integration (GSI) in the 21st Century", *Proceedings of the IEEE*, vol. 89, No. 3, pp. 305-324 (2001).

(Continued)

*Primary Examiner*—Cuong Nguyen
(74) *Attorney, Agent, or Firm*—Scully, Scott, Murphy & Presser, P.C.; Joseph P. Abate, Esq.

(57) ABSTRACT

The present invention provides a strained-Si structure, in which the nFET regions of the structure are strained in tension and the pFET regions of the structure are strained in compression. Broadly the strained-Si structure comprises a substrate, a first layered stack atop the substrate, the first layered stack comprising a first Si-containing portion of the substrate, a compressive layer atop the Si-containing portion of the substrate, and a semiconducting silicon layer atop the compressive layer; and a second layered stack atop the substrate, the second layered stack comprising a second-silicon containing layer portion of the substrate, a tensile layer atop the second Si-containing portion of the substrate, and a second semiconducting silicon-layer atop the tensile layer.

10 Claims, 10 Drawing Sheets

U.S. PATENT DOCUMENTS

| | | | |
|---|---|---|---|
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,703,293 B2 | 3/2004 | Tweet et al. | |
| 6,717,216 B1 | 4/2004 | Doris et al. | |
| 6,825,086 B2 | 11/2004 | Lee et al. | |
| 6,825,529 B2 | 11/2004 | Chidambarrao et al. | |
| 6,831,292 B2 | 12/2004 | Currie et al. | |
| 6,844,227 B2 * | 1/2005 | Kubo et al. | 257/103 |
| 6,891,192 B2 | 5/2005 | Chen et al. | |
| 6,943,407 B2 * | 9/2005 | Ouyang et al. | 257/351 |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0003364 A1 | 6/2001 | Sugawara et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2002/0105015 A1 * | 8/2002 | Kubo et al. | 257/19 |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2003/0086472 A1 | 5/2003 | Bengtsson et al. | |
| 2003/0087492 A1 | 5/2003 | Lee et al. | |
| 2004/0113174 A1 | 6/2004 | Chidambarrao et al. | |
| 2004/0113217 A1 | 6/2004 | Chidambarro et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |

OTHER PUBLICATIONS

"Grand Challenges", *The International Technology Roadmap For Semiconductors*, pp. 9-15 (2002).

Novel Locally Strained Channel Technique for High Performance 55nm CMOS K. Ota, et al. 2002 IEEE, 2.2.1-2.2.4, IEDM 27.

Local Mechanical Stress Control (LMC): A New Technique for CMOS—Performance Enchancement A. Shimizu, et al. 2001 IEEE, 19.4.1-19.4.4, IEDM 01-433..

Mechanical Stress Effect of Etch-Stop Nitride and its Impact on Deep Submicron Transistor Design Shinya Ito, et al. 2000 IEEE, 10.7.1-10,7.4, IEDM 00-247.

A Highly Dense, High-Performance 130nm node CMOS Technology for Large Scale System -on-a- Chip Applications F. Ootsuka, et al. 2000 IEEE, 23.5.1-23.5.4, IEDM 00-575.

NMOS Drive Current Reduction Caused by Transistor-Layout and Trench Isolation Induced Stress Gregory Scott, et al. 1999 IEEE, 34.4.1-34.4.4, IEDM 99-827.

Transconductance Enhancement in Deep Submicron Strained-Si n-MOSFETs Kern (Ken) Rim, et al., 1998 IEEE, 26.8.1-26.8.4, IEDM 98-707.

Characteristics and Device Design of Sub-100 nm Strained Si N- and PMOSFET's K. Rim, et al. 2002 IEEE, 98-99, 2002 Symposium On VLSI Technology Digest of Technical Papers.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al, "Temperature Dependence of Emitter-Base Reverse Stress Degradation and Its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier Induced Degradation in Bipolar Transistors for BiCMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100)Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

STRAINED SI ON MULTIPLE MATERIALS FOR BULK OR SOI SUBSTRATES

FIELD OF THE INVENTION

The present invention relates to semiconductor materials having enhanced electron and hole mobilities, and more particularly, to semiconductor materials that include a silicon (Si)-containing layer having enhanced electron and hole mobilities. The present invention also provides methods for forming such semiconductor materials.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that MOSFETs are beginning to reach their traditional scaling limits. A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities. One method for increasing carrier mobility is to introduce an appropriate strain into the Si lattice.

The application of stresses or strains changes the lattice dimensions of the Si-containing. By changing the lattice dimensions, the energy gap of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. Thus, the change in resistance of the material with stress is large.

Prior attempts to provide strain-based improvements of semiconductor substrates have utilized etch stop liners or embedded SiGe structures. N-type channel field effect transistors (nFETs) need tension on the channel for strain-based device improvements, while p-type channel field effect transistors (pFETs) need a compressive force on the channel for strain-based device improvements. Further scaling of semiconducting devices requires that the strain levels produced within the substrate be controlled and that new methods be developed to increase the strain that can be produced.

In view of the state of the art mentioned above, there is a continued need for providing strained-Si substrates in bulk-Si or SOI substrates in which the substrate can be appropriately strained for both nFET and pFET devices.

SUMMARY

The present invention provides a strained-Si substrate, in which the nFET regions of the substrate are strained in tension and the pFET regions of the substrate are strained in compression. The present invention also provides a strained-Si substrate incorporating either bulk-Si or SOI substrate configurations.

The foregoing is achieved in the present invention by positioning a compressive SiGe layer or tensile Si:C layer underlying a semiconducting layer. The term "compressive SiGe layer" denotes that a SiGe layer is under an internal compressive strain (also referred to as an intrinsic compressive strain), in which the compressive strain is produced by a lattice mismatch between the larger lattice dimension of the compressive SiGe layer and the smaller lattice dimension of the layer on which the compressive SiGe layer is epitaxially grown. The term "tensile Si:C layer" denotes that a Si:C layer is under an internal tensile strain (also referred to as an intrinsic tensile strain), in which the tensile strain is produced by a lattice mismatch between the smaller lattice dimension of the tensile Si:C layer and the larger lattice dimension of the layer on which the tensile Si:C layer is epitaxially grown.

The compressive SiGe layer elastically transfers tensile stresses to the overlying semiconducting layer. Therefore, the compressive SiGe layer provides strain based device improvements for n-type field effect transistors (nFETs). The tensile Si:C layer elastically transfers compressive stresses to the overlying semiconducting layer. Therefore, the tensile Si:C layer provides strain based device improvements for p-type field effect transistors (pFETs). Broadly, the inventive strained-Si substrate comprises:

a substrate;

a first layered stack atop the substrate, the first layered stack comprising a first Si-containing portion of the substrate, a compressive layer atop the first Si-containing portion of the substrate, and a first semiconducting layer atop the compressive layer;

a second layered stack atop the substrate, the second layered stack comprising a second-Si-containing layer portion of the substrate, a tensile layer atop the second Si-containing portion of the substrate, and a second semiconducting layer atop the tensile layer; and an isolation region separating the first layered stack and the second layered stack. The compressive layer incorporated into the first stack has lattice dimensions greater than the underlying Si-containing portion of the substrate. The compressive layer may comprise SiGe. The first semiconducting layer may be a Si-containing material that has lattice dimensions smaller than the compressive layer.

The compressive layer elastically transfers tensile strain to the overlying first semiconducting layer. Therefore, the first semiconducting layer is strained to provide strained-Si device improvements for nFET devices, in which the tensile strain transferred from the compressive layer to the overlying first semiconducting layer increases the carrier mobility for n-type channels.

The tensile layer incorporated into the second stack has lattice dimensions that are less than the underlying Si-containing portion of the substrate. The tensile layer may comprise silicon doped with carbon (Si:C). The second semiconducting layer may be a Si-containing material that has lattice dimensions greater than the tensile layer.

The tensile layer elastically transfers compressive strain to the second semiconducting layer. Therefore, the second semiconducting layer is strained to provide strained-Si device improvements for pFET devices, in which the compressive stress transferred from the tensile layer to the overlying second semiconducting layer increases the carrier mobility for p-type channels. The substrate, on which the first layered stack and second layered stack is formed, can be an SOI substrate or a bulk-Si substrate.

Another aspect of the present invention is a method for forming the above described strained-Si substrate. Broadly, the inventive method for forming a strained-Si substrate comprises:

providing a Si-containing substrate;

forming a first pad stack atop a first portion of the Si-containing substrate, the first pad stack comprising a compressive layer positioned atop the first portion of the Si-containing substrate, a first semiconducting layer atop the compressive layer and a first etch barrier atop the first semiconducting layer;

forming a second pad stack atop a second portion of the Si-containing substrate, the second pad stack comprising a tensile layer positioned atop the second portion of the Si-containing layer, a second semiconducting layer atop the tensile layer, and a second etch barrier atop the second semiconducting layer;

etching the Si-containing substrate selective to the first etch stop barrier and the second etch stop barrier, wherein the compressive layer elastically transfers a tensile strain to the first semiconducting layer and the tensile layer elastically transfers a compressive strain to second semiconducting layer;

removing the first etch stop barrier and the second etch stop barrier; and forming an isolation region between the first pad stack and the second pad stack.

The compressive layer can be formed by epitaxially growing SiGe atop the Si-containing substrate, wherein the SiGe is grown to a thickness that is less than the critical thickness of SiGe. If the thickness of the SiGe is greater than the critical thickness, the layer can relax due to the formation of defects. The tensile layer can be formed by epitaxially growing Si, which is in-situ doped with carbon. The Si:C tensile layer may be grown to a thickness that is less than the critical thickness of Si:C. If the thickness of Si:C exceeds it's critical thickness, the layer will relax due to the formation of defects. To maintain tension within the tensile layer, the Si:C should not be thicker than the critical thickness.

BRIEF DESCRIPTION OF THE DRAWINGS

FIGS. 4(a)–10(a) illustrate (through cross-sectioned views) the process steps for producing the structure depicted in FIG. 1(a).

FIGS. 4(b)–10(b) illustrate (through cross-sectioned views) the process steps for producing the structure depicted in FIG. 1(b).

DETAILED DESCRIPTION OF THE INVENTION

The present invention provides substrates comprising both a compressively strained semiconducting portion and a tensile strained semiconducting portion, and a method of forming the same.

The present invention advantageously provides substrates having both compressively strained and tensile strained semiconducting portions by forming a first and second material stack atop a substrate, in which the first material stack comprises a compressive layer that elastically transfers a tensile strain to an overlying semiconducting portion and the second material stack comprises a tensile layer that elastically transfers a compressive strain to an overlying semiconducting portion. The present invention is now discussed in more detail referring to the drawings that accompany the present application. In the accompanying drawings, like and or corresponding elements are referred to by like reference numbers.

The present invention provides material stacks of different lattice materials for nFET and pFET devices that can be incorporated onto the same substrate. It is advantageous for nFETs to have a channel region that is strained in tension and for pFETs to have a channel that is strained in compression, where the strain applied to the channel improves the device's performance.

Figure 1A:
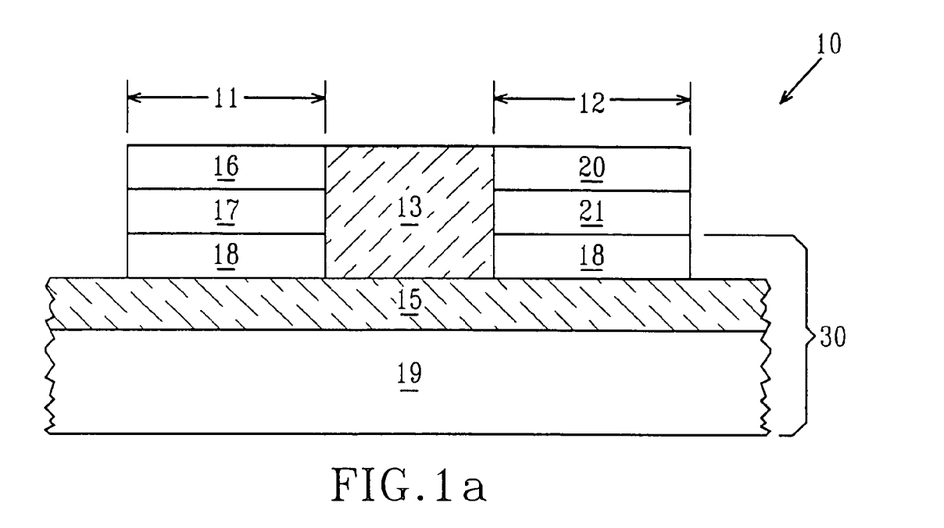
FIG. 1(a) illustrates (through a cross-sectional view) one embodiment of the present invention including a SOI substrate having a compressively strained semiconducting portion and a tensile strained semiconducting portion.

Referring to FIG. 1(a), in one embodiment of the present invention, an nFET stack 11 and a pFET stack 12 are positioned on a buried insulating layer 15 of a silicon-on-insulator (SOI) substrate 30, in which the nFET stack 11 and the pFET stack 12 are separated by an isolation region 13.

The nFET stack 11 comprises a first semiconducting layer 16, a compressive SiGe layer 17 and a Si-containing substrate portion 18. The Si-containing substrate portion 18 is formed from the upper Si-containing layer of the SOI substrate 30. The compressive SiGe layer 17 elastically transfers a tensile strain to the overlying first semiconductor layer 16. The first semiconducting layer 16 is under a tensile strain and is therefore well suited to be the channel region of an nFET device.

The pFET stack 12 comprises a second semiconducting layer 20, a tensile Si:C layer 21, and a Si-containing substrate portion 18. The Si-containing substrate portion 18 is formed from the upper Si-containing layer of the SOI substrate 30. The tensile Si:C layer 21 elastically transfers a compressive strain to the overlying second semiconductor layer 20. The second semiconducting layer 20 is under a compressive strain and is therefore well suited to be the channel region of a pFET device.

Figure 1B:
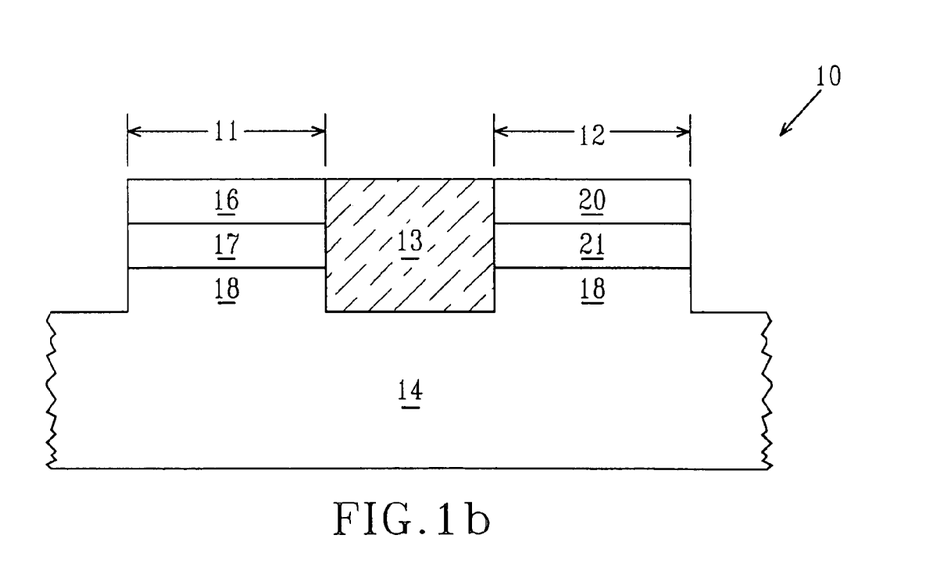
FIG. 1(b) illustrates (through a cross-sectional view) one embodiment of the present invention including a bulk-Si substrate having a compressively strained semiconducting portion and a tensile strained semiconducting portion.

FIG. 1(b) represents another embodiment of the present invention, in which an nFET stack 11 and a pFET stack 12 are formed on a bulk-silicon (bulk-Si) substrate 14. In this embodiment, the Si-containing substrate portion 18 of the nFET stack 11 and the pFET stack 12 are mesa portions of the bulk-Si substrate 14, which are produced using a timed directional etch process.

Figure 2:
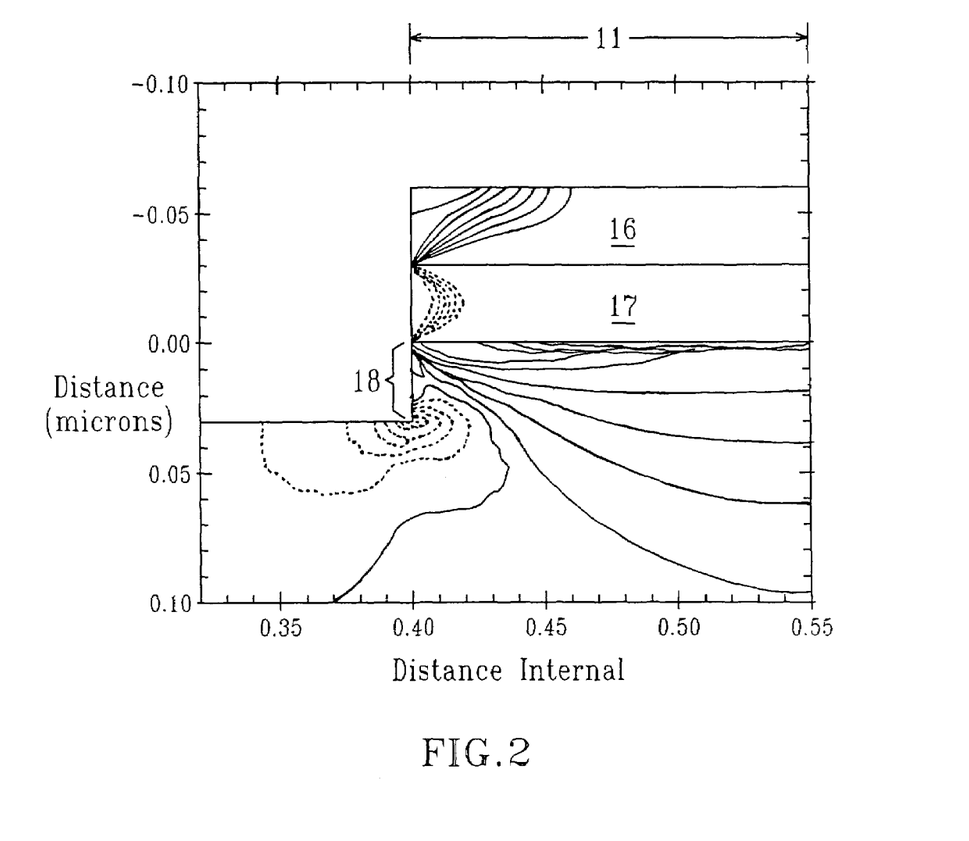
FIG. 2 depicts (through a cross-sectional view) the compressive and tensile stresses of one embodiment of the present invention having a material stack comprising a SiGe layer.

Referring to FIG. 2, the tensile strain produced in the first semiconducting layer 16 of the nFET stack 11 is produced by the appropriate combinations of different lattice materials positioned in the stacked structure. Specifically, the lattice structures of the Si-containing substrate portion 18 and the SiGe compressive layer 17 allow for the SiGe layer to be compressively strained. The compressive strain is the result of the larger lattice dimensions of SiGe being epitaxially grown atop the smaller lattice dimensions of the underlying Si-containing substrate portion 18. Silicon has a lattice dimension of approximately 5.43 Å, and Ge has a lattice structure on the order of about 5.65 Å. During epitaxial growth, SiGe is grown so that the larger lattice structure of the SiGe grows atop and is aligned to the smaller lattice structure of the underlying Si-containing substrate portion 18. Therefore, the SiGe is grown having a smaller lattice than is energetically favorable and a compressive strain is produced within the SiGe.

The first semiconducting layer 16 is epitaxially grown atop the compressive SiGe layer 17, in which the first semiconducting layer 16 comprises a Si-containing material having a smaller lattice structure than the compressive SiGe layer 17. Following epitaxially growth of the first semiconducting layer 16, the nFET stack 11 is etched so that the exposed edge of the compressive SiGe layer 17 elastically relaxes and transfers a tensile strain to the overlying first semiconducting layer 16.

Referring to FIG. 2, a simulation of one embodiment of an nFET stack 11 of the present invention is provided, where the solid lines represent stress in tension and the dotted lines represent stress in compression. In the simulation depicted, a compressive SiGe layer 17 is formed having a thickness on the order of 250 Å comprising Ge present in a concentration of approximately 25%, by atomic weight %, were a compressive stress on the order of about 2000 MPa is produced by the above described lattice mismatch. Still referring to FIG. 2, the compressive SiGe layer 17 elastically transfers tensile stresses, on the order of 250 MPa, to the overlying first semiconducting layer 16, which comprises epitaxially grown silicon having a thickness on the order of about 250 Å.

Figure 3:
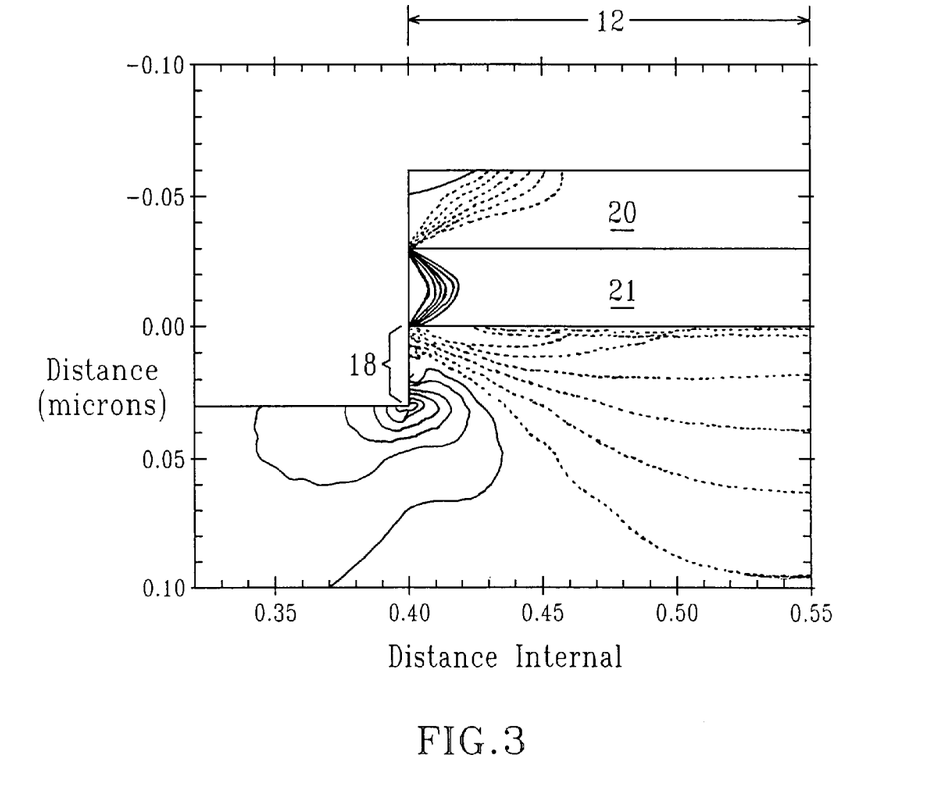
FIG. 3 depicts (through a cross-sectional view) the compressive and tensile stresses of one embodiment of the present invention having a material stack comprising a Si:C layer.

Referring now to FIG. 3, the compressive strain produced in the second semiconducting layer 20 of the pFET stack 12 is produced by the appropriate combinations of different lattice dimension materials positioned in a stacked structure. Specifically, the lattice structures of the Si-containing substrate portion 18 and the Si:C tensile layer 21 allow for the Si:C layer 21 to be strained in tension. The tensile strain is the result of the smaller lattice dimension of Si:C layer being epitaxially grown atop the larger lattice dimension of the underlying Si-containing substrate portion 18. The size of the carbon atoms introduced into the Si is small enough, that when incorporated into a material layer of Si it produces a field of tensile strain around the carbon atom. By incorporating carbon into a Si material layer a tensile stress may be produced within the material layer on the order of about 1000 MPa for every 2% of carbon present, by atomic weight %.

The tensile Si:C tensile layer 21 is epitaxially grown so that the smaller lattice structure of the Si:C grows atop and is aligned to the larger lattice structure of the underlying Si-containing layer 18. Therefore, the Si:C is grown having a larger lattice than is energetically favorable and a tensile strain is produced within the Si:C.

The second semiconducting layer 20 is epitaxially grown atop the Si:C tensile layer 21, in which the second semiconducting layer 20 comprises a Si-containing material having a larger lattice structure than the tensile Si:C layer 21. Following the epitaxial growth of the second semiconducting layer 20, the pFET stack 12 is etched so that the exposed edge of the tensile Si:C layer 21 elastically relaxes and transfers a compressive strain to the overlying second semiconducting layer 20.

Referring to FIG. 3, a simulation of one embodiment of a pFET stack 12 of the present invention is provided, where the solid lines represent stress in tension and the dotted lines represent stress in compression. In the simulation depicted, a tensile Si:C layer 21 is formed having a thickness on the order of 250 Å comprising C present in a concentration of approximately 4% by atomic weight %, in which the tensile stress produced by the above described lattice mismatch is on the order of about 2000 MPa. Still referring to FIG. 3, the tensile Si:C layer 21 elastically transfers a compressive stress, on the order of 250 MPa, to the overlying second semiconducting layer 20, which comprises epitaxially grown silicon having a thickness on the order of about 250 Å.

As discussed above, depositing a material layer (such as the compressive SiGe layer 17 or the tensile Si:C layer 21) having a different energetically favorable lattice dimension than the surface on which the material layer is grown (such as the Si-containing substrate) produces a strain, since the lattice dimension of the material layer is strained to match the lattice dimension of the surface on which the material layer is grown. This form of growth may be referred to as pseudomorphic growth.

The strain produced in the material layer is maintained so long as the material layer is not grown to a thickness greater than it's critical thickness. If the material layer is grown to a thickness greater than it's critical thickness, the material layer will grow having it's energetically favorable lattice dimension that differs from the lattice dimension of the surface on which the material layer is grown. This type of growth, in which the lattice dimensions of the material layer are no longer matched to the surface on which the material layer is deposited, may be referred to as incommensurate growth. The difference in lattice dimension of the material layer and the surface, on which the material layer is grown, results in the formation of misfit dislocations.

Once the deposited layer surpasses it's critical thickness, relaxation can occur through slip mechanisms, such as dislocation motion. Relaxation disadvantageously diminishes the internal strain produced in the deposited layer. The "critical thickness" is the maximum thickness at which the layer will not relax.

In order for the strain produced in the compressive SiGe layer 17, the tensile Si:C layer 21, the first semiconducting layer 16, and the second semiconducting layer 20 of the present invention to be maintained, the thickness of the layer in which the strain is produced must be below it's critical thickness. Expressed in terms of dislocation density, the critical thickness of the present invention is the maximum thickness of the strained layer in which the dislocation density is less than $1.0 \times 10^5$ cm$^2$.

The method for forming a strained-Si substrate that simultaneously comprises both appropriately strained nFET and pFET regions, is now discussed in greater detail. The method for forming appropriately strained nFET and pFET regions atop a silicon-on-insulator (SOI) substrate, as depicted in FIG. 1(a), is described with reference to FIGS. 4(a)–9(a). The method for forming appropriately strained nFET and pFET regions atop a bulk-Si substrate, as depicted in FIG. 1(b), is described with reference to FIGS. 4(b)–9(b).

Figure 4A:
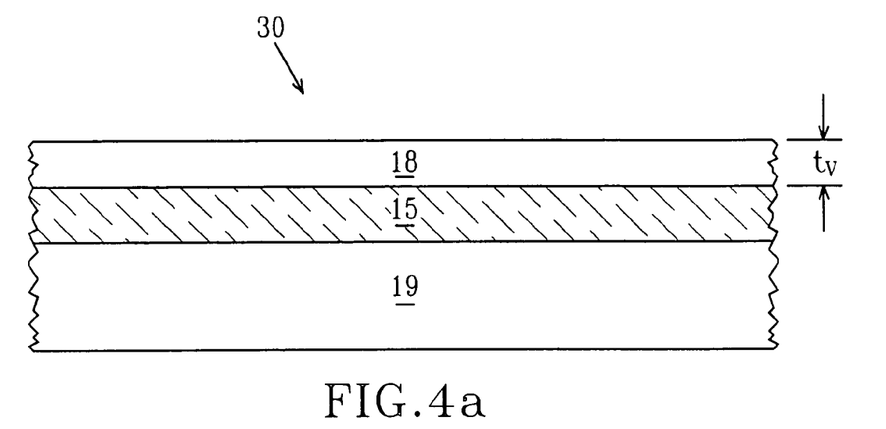

Referring to FIG. 4(a), a SOI substrate 30 is provided comprising bottom Si-containing layer 19, a buried insulating layer 15 present atop the bottom Si-containing layer 19, and top Si-containing layer 18 present atop the surface of the buried insulating layer 15. The term "Si-containing layer" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., a:Si, and multilayers thereof. A preferred Si-containing material for the top and bottom Si-containing layers 18 and 19 is Si.

The top Si-containing layer 18 of SOI substrate 10 typically has a vertical thickness, $t_v$, i.e., height, of less than about 300 nm, with a vertical thickness from about 20 nm to about 50 nm being more typical. The composition of the top Si-containing layer 18 should have a lattice dimension that is smaller than the lattice dimension of the subsequently formed compressive SiGe layer and larger than the subsequently formed tensile Si:C layer. The top Si-containing layer 18 is hereafter referred to as the Si-containing substrate portion 18.

The thickness of the buried insulating layer 15 may vary, but typically, the buried insulating layer 15 has a thickness of less than about 350 nm, with a thickness from about 70 to about 150 nm being more highly preferred. The thickness of the bottom Si-containing layer 19 is inconsequential to the present invention.

Figure 4B:
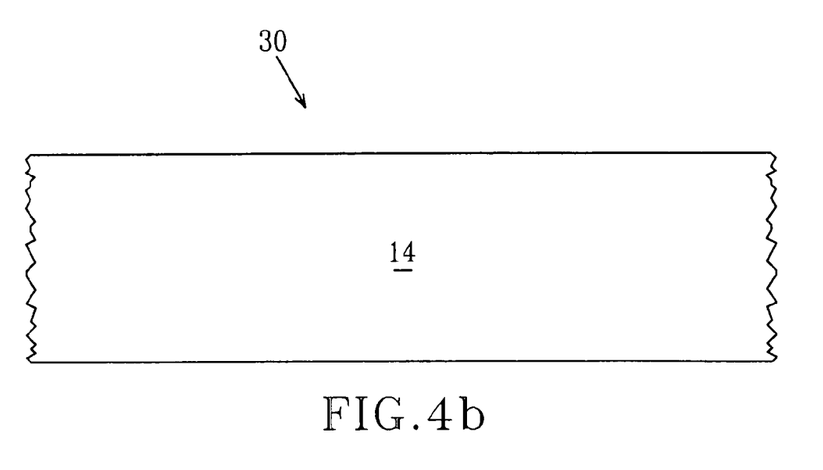

The SOI substrate 30 is fabricated using techniques that are well known to those skilled in the art. For example, the SOI substrate 30 may be fabricated using a thermal bonding process, or alternatively the SOI substrate 30 may be fabricated by an ion implantation process, which is referred to in the art as separation by ion implantation of oxygen (SIMOX). When a thermal bonding process is employed in fabricating the SOI substrate 30, an optional thinning step may be utilized to thin the top Si-containing layer 18 into an ultra-thin regime, which is on the order of less than 50 nm. The substrate 30 can also be a bulk-Si substrate 14, preferably comprising single crystal-Si, as depicted in FIG. 4(b).

Figure 5A:
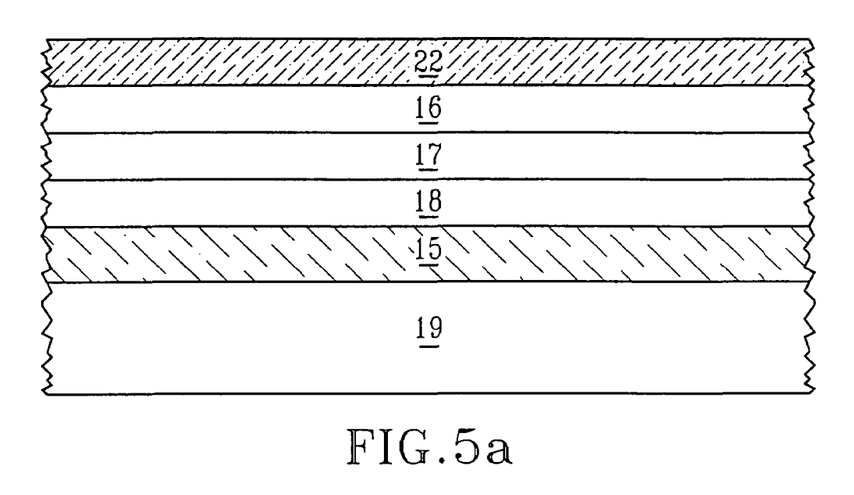

Referring to FIG. 5(a), a compressive SiGe layer 17 is then formed atop the entire SOI substrate 30 depicted in FIG. 4(a). The compressive SiGe layer 17 can be grown using an epitaxial growth process. The Ge content of the compressive SiGe layer 17 may range from 5% to 50%, by atomic weight %, preferably ranging from 10% to 20%, more preferably being 15%.

Figure 5B:
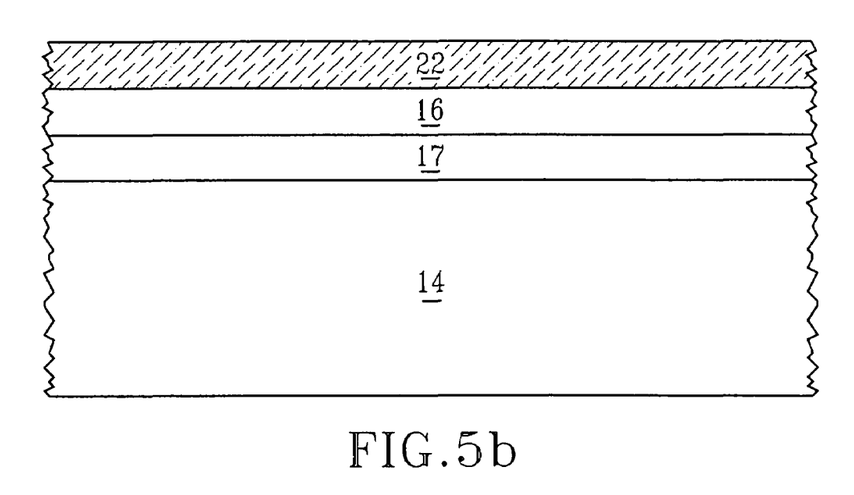

The compressive SiGe layer 17 is grown to a thickness that is less than it's critical thickness. Typically, the compressive SiGe layer 17 can be grown to a thickness ranging from about 10 nm to about 100 nm. The critical thickness of the compressive SiGe layer 17 is dependent on the Ge concentration of the layer. The critical thickness is also partial to high temperature processing steps, such as activation anneal, which are on the order of about 1100° C. The temperature of the SiGe growth process may range from about 500° C. to about 800° C. In one example, when the Ge content of the compressive SiGe layer 17 is on the order of about 15%, by atomic weight %, the critical thickness of the compressive SiGe layer 17 is on the order of about 100 nm. It is noted that high temperature processing steps may reduce the critical thickness of the compressive SiGe layer 17 to about 20 nm. FIG. 5(b) represents this process step when the compressive SiGe layer 17 is formed atop a bulk-Si substrate 14.

Referring to FIG. 5(a), the first semiconducting layer 16 is then formed atop the compressive SiGe layer 17. The first semiconducting layer 16 comprises an epitaxially grown Si-containing material having lattice dimensions that are less than the lattice dimensions of the underlying compressive SiGe layer 17.

The first semiconducting layer 16 can be grown to a thickness that is less than it's critical thickness. Typically, the first semiconducting layer 16 can be grown to a thickness ranging from about 10 nm to about 100 nm The critical thickness of the first semiconducting layer 16 is on the order of 100 nm or less, depending on the properties of the underlying compressive SiGe layer 17. In one example, when the Ge content of the compressive SiGe layer 17 is on the order of about 15% by atomic weight %, the critical thickness of the first semiconducting layer 16 is on the order of about 100 nm. It is noted that high temperature processing steps may reduce the critical thickness of the first semiconducting layer 16 to about 20 nm. FIG. 5(b) represents this process step when the first semiconducting layer 16 is formed atop the compressive SiGe layer 17 positioned on the bulk-Si substrate 14.

Referring back to FIG. 5(a), a first cap layer 22 is formed deposited atop the first semiconducting layer 16. The first cap layer 22 may be any dielectric such as an oxide, nitride, or oxynitride, preferably being a nitride, such as $Si_3N_4$. Combinations of said dielectrics are also contemplated herein. The first cap layer 22 is deposited using deposition methods, such as chemical vapor deposition (CVD), plasma-assisted CVD, high-density chemical vapor deposition (HD-CVD), and chemical solution deposition. The first cap layer 22 has a preferred thickness ranging from about 20 nm to about 30 nm. FIG. 5(b) represents this process step when utilizing a bulk-Si substrate 14.

Figure 6A:
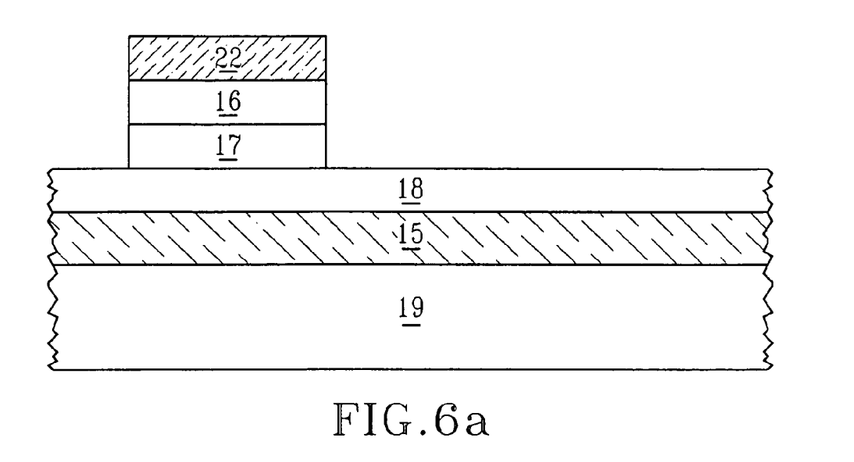

Referring to 6(a), in a next process step the first cap layer 22 is patterned and etched to provide an etch mask that is subsequently utilized to pattern the nFET stack. Specifically, a pattern is produced by applying a photoresist to the surface to be etched; exposing the photoresist to a pattern of radiation; and then developing the pattern into the photoresist utilizing a conventional resist developer. Once the patterning of the photoresist is completed, the sections of the first cap layer 22 covered by the photoresist are protected, while the exposed regions are removed using a selective etching process that removes the unprotected regions of the first cap layer 22 without substantially etching the underlying first semiconducting layer 16. The patterned first cap layer 22 is then utilized as an etch mask to etch the first semiconducting layer 16 and the compressive SiGe layer 17. Preferably a directional etch process, such as reactive ion etch, is utilized to etch the first semiconductor layer 16 and the compressive SiGe layer 17.

Figure 6B:
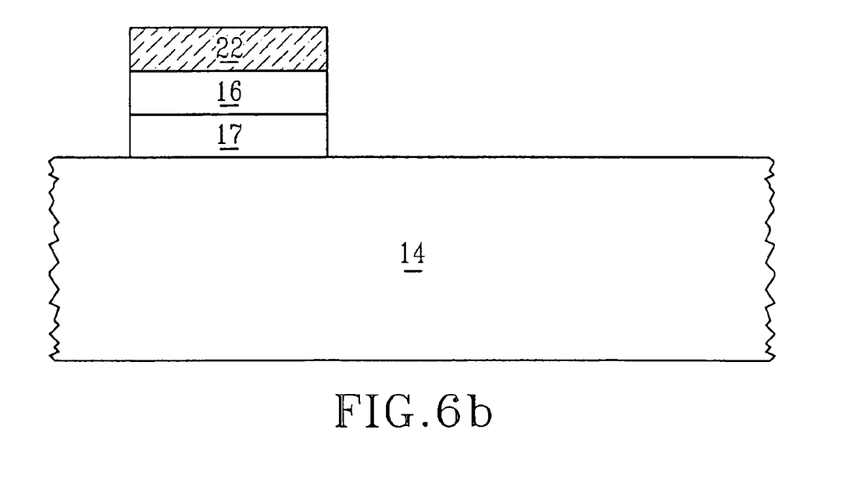

In a preferred embodiment, the first semiconductor layer 16 is etched with an etch chemistry that does not substantially etch the first cap layer 22 or the underlying compressive SiGe layer 17. Following first semiconductor layer 16 etch, the compressive SiGe layer 17 is then etched using an etch chemistry that does not substantially etch the Si-containing substrate portion 18. FIG. 6(b) depicts patterning and etching the first cap layer 22, the first semiconducting layer 16, and the compressive SiGe layer 17 atop a bulk-Si substrate 14.

Figure 7A:
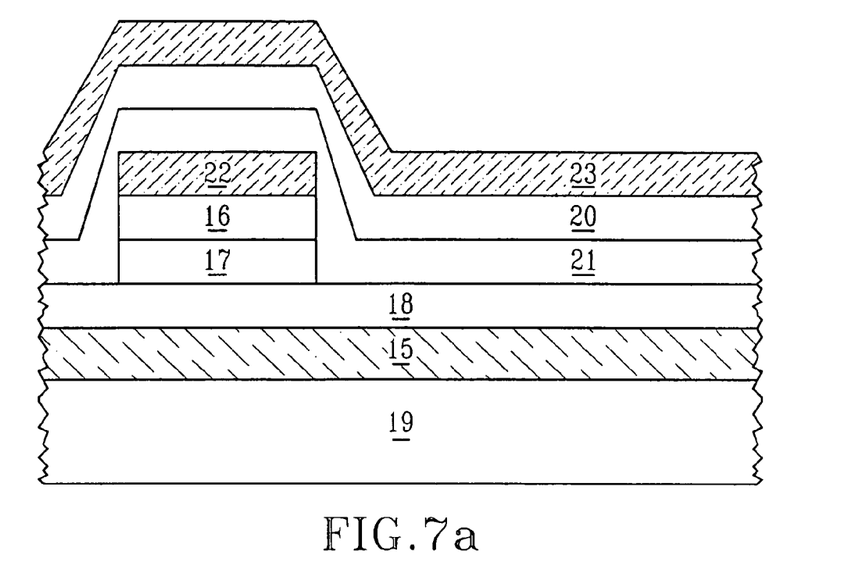

Turning to FIG. 7(a), a tensile Si:C layer 21 is then formed atop the entire structure depicted in FIG. 6(a). The tensile Si:C layer 21 may be grown using an epitaxial growth process. The C content of the compressive Si:C layer 21 is less than about 6%, by atomic weight %, preferably ranging from 1% to 4%, more preferably being 3%. The tensile Si:C layer 17 is grown to a thickness that is less than its' critical thickness. Typically, the tensile Si:C layer 17 is grown to a thickness ranging from about 10 nm to about 100 nm. The critical thickness of the tensile Si:C layer 17 is dependent on the C concentration of the layer. The temperature of the Si:C growth process may range from about 500° C. to about 800° C. In one example, when the C content of the tensile Si:C layer 21 is on the order of about 3%, by atomic weight %, the critical thickness of the tensile Si:C layer 21 is on the order of about 100 nm. It is noted that high temperature processing steps may reduce the critical thickness of the tensile Si:C layer 17 to about 20 nm.

Referring to FIG. 7(a), a second semiconducting layer 20 is then formed atop the tensile Si:C layer 21. The second semiconducting layer 20 comprises an epitaxially grown Si-containing material having lattice dimensions that are greater than the lattice dimensions of the underlying tensile Si:C layer 21.

Figure 7B:
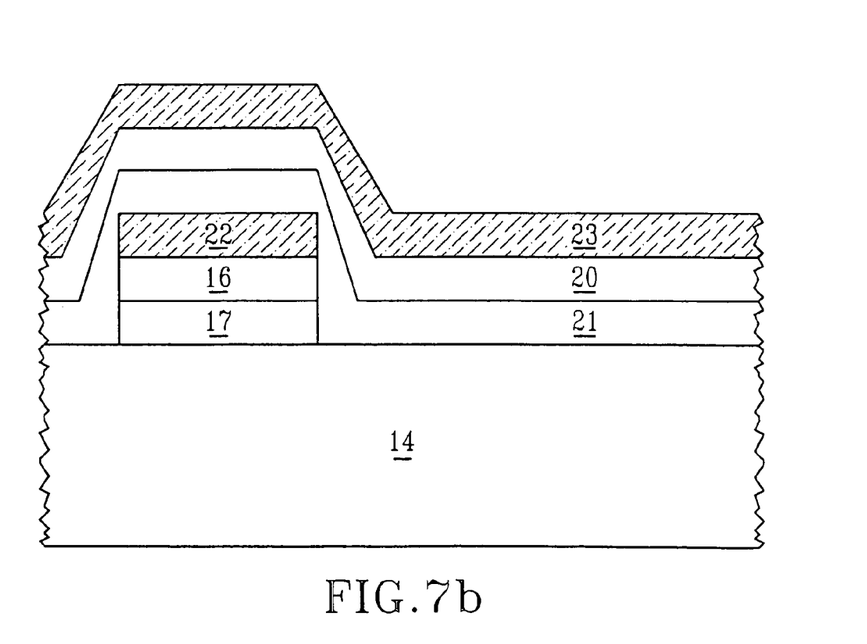

The second semiconducting layer 20 can be grown to a thickness that is less than it's critical thickness. Typically, the second semiconducting layer 20 can be grown to a thickness ranging from about 10 nm to about 100 nm. The critical thickness of the second semiconducting layer 20 is on the order of 100 nm or less, depending on the properties of the underlying tensile Si:C layer 20. In one example, when the C content of the tensile Si:C layer 21 is on the order of about 3%, by atomic weight %, the critical thickness of the second semiconducting layer 20 is on the order of about 100 nm. It is noted that high temperature processing steps may reduce the critical thickness of the second semiconducting layer 20 to about 20 nm. FIG. 7(b) represents this process step when the second semiconducting layer 20 is formed atop the tensile Si:C layer 21 positioned on the bulk-Si substrate 14.

Referring back to FIG. 7(a), a second cap layer 23 is then formed atop the second semiconducting layer 20. The second cap layer 23 may be any dielectric such as an oxide, nitride, oxynitride, or a combination thereof, preferably being a nitride, such as $Si_3N_4$. The second cap layer 23 is deposited using deposition methods, such as chemical vapor deposition (CVD), plasma-assisted CVD, high-density chemical vapor deposition (HDCVD), and chemical solution deposition. The second cap layer 23 has a thickness ranging from about 20 nm to about 30 nm. FIG. 7(b) represents this process step when utilizing a bulk Si substrate 14.

Figure 8A:
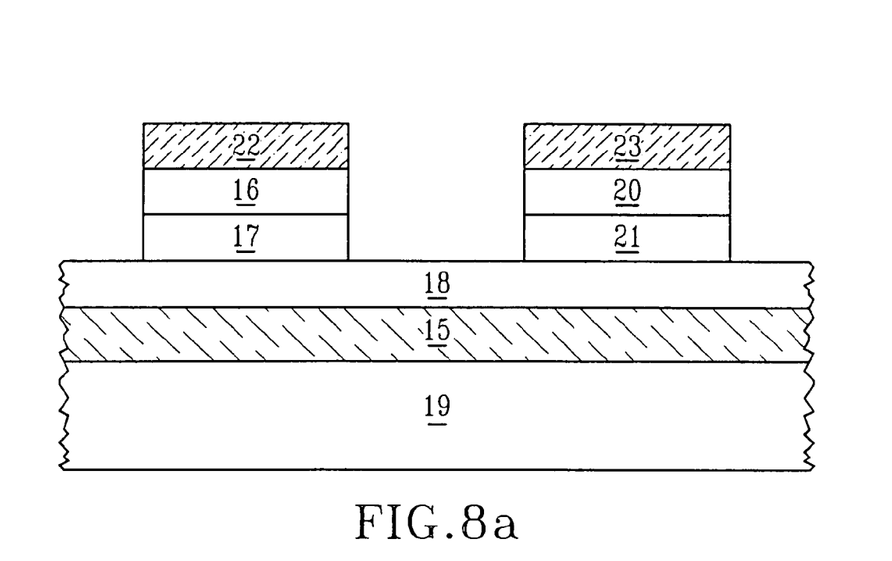

Referring to 8(a), in a next process step the second cap layer 23 is patterned and etched to provide an etch mask that is subsequently utilized to pattern the pFET stack. Specifically, a pattern is produced by applying a photoresist to the surface to be etched; exposing the photoresist to a pattern of radiation; and then developing the pattern into the photoresist utilizing a conventional resist developer.

Once the patterning of the photoresist is completed, the sections of the second cap layer 23 covered by the photoresist are protected, while the exposed regions are removed using a selective etching process that removes the unprotected regions of the second cap layer 23 without substantially etching the underlying second semiconducting layer 20. The patterned second cap layer 23 is then utilized as an etch mask to etch the second semiconducting layer 20 and the tensile Si:C layer 21. Preferably a directional etch process, such as reactive ion etch, is utilized to etch the second semiconductor layer 20 and the compressive Si:C layer 21.

Figure 8B:
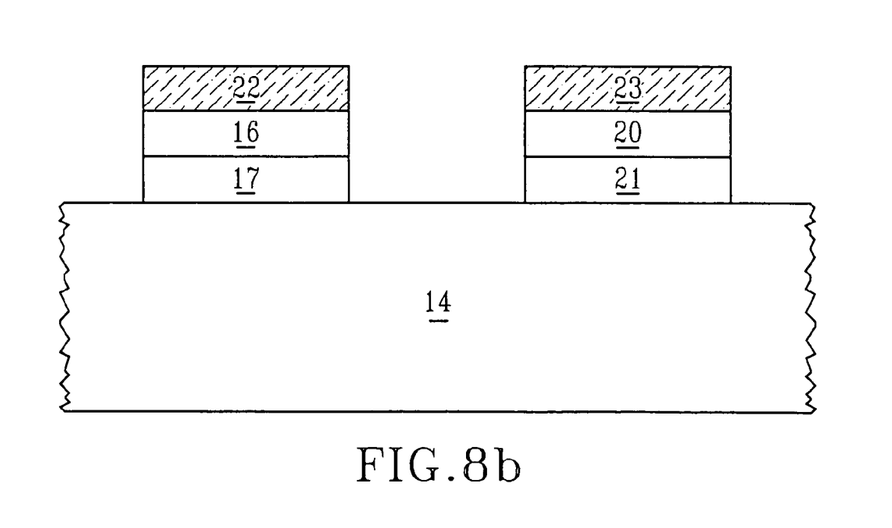

In a preferred embodiment, the second semiconductor layer 20 is etched with an etch chemistry that does not substantially etch the second cap layer 23 or the underlying tensile Si:C layer 21. Following second semiconductor layer 20 etch, the tensile Si:C layer 21 is then etched using an etch chemistry that does not substantially etch the Si-containing substrate portion 18. It is noted that the first cap layer 22 protects the underlying portions of the first semiconducting layer 16 and the compressive SiGe layer 17 during this etch step. FIG. 8(b) depicts patterning and etching the second cap layer 23, the second semiconducting layer 20, and the tensile Si:C layer 21 atop a bulk-Si substrate 14.

Figure 9A:
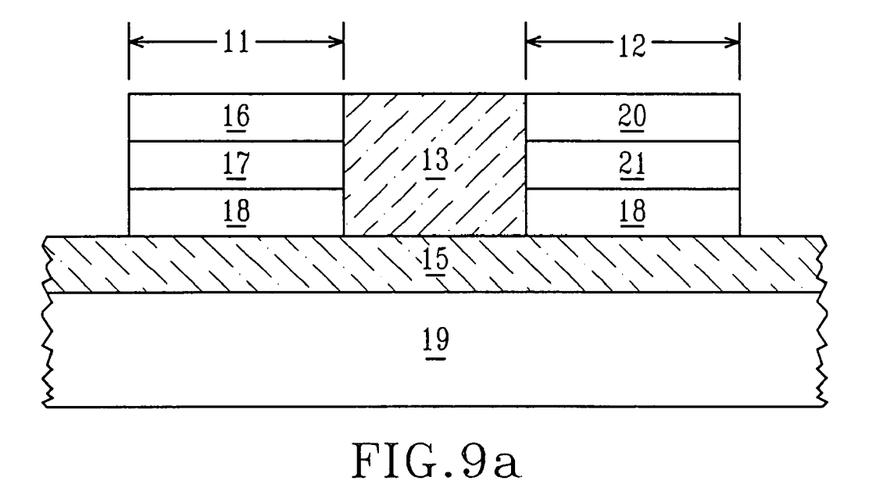

Referring to FIG. 9(a), in a next process step the Si-containing substrate portion 18 is then etched with a highly selective directional etch process, such as reactive ion etch, in which the first cap layer 22 and the second cap layer 23 function as an etch mask for the nFET stack 11 and the pFET stack 12. Preferably, the etch chemistry selectively etches the Si-containing substrate portion 18 without substantially etching the first cap layer 22, the second cap layer 23, and the buried insulating layer 15. The etch process may be timed or may utilize end point detection. Following Si-containing substrate portion 18 etch the first cap layer 22 and the second cap layer 23 are removed using a wet etch process.

Figure 9B:
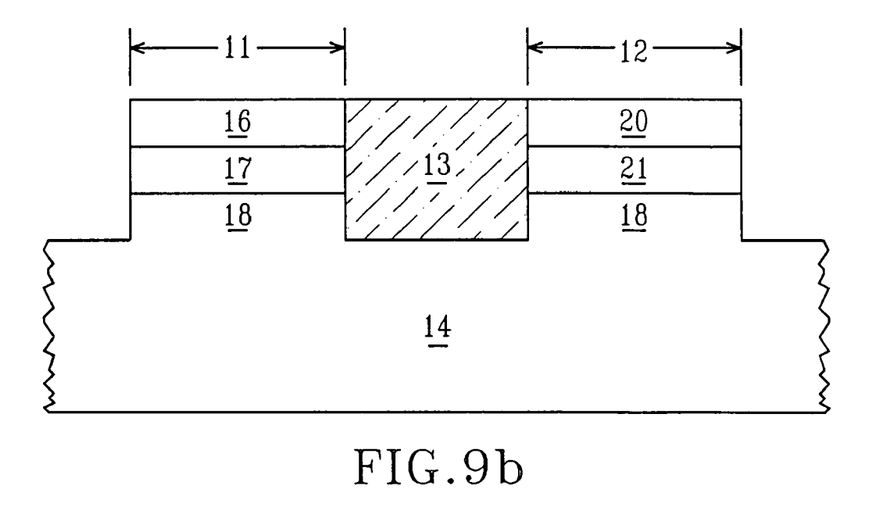

FIG. 9(b) depicts this process step when forming strained nFET 11 and pFET 12 stacks on a bulk-Si substrate 14. In this embodiment, the upper surface of the bulk-Si substrate 14 is etched with a highly selective directional etch process, such as reactive ion etch, in which the first cap layer 22 and the second cap layer 23 function as an etch mask for the nFET stack 11 and the pFET stack 12. In this embodiment, the etch process may be timed so that the surface of the bulk Si substrate 14 is etched to a depth ranging from about 20 nm to about 50 nm. The portion of the bulk-Si substrate 14 protected by the first and second cap layers 22, 23 during substrate etch and underlying the compressive SiGe layer 17 and the tensile Si:C layer 21 is the Si-containing substrate portion 18 of the nFET and pFET stacks 11, 12.

Referring back to FIG. 9(a), an isolation region 13 is then formed separating the nFET stack 111 and the pFET stack 12. The isolation regions 13 may optionally be lined with a conventional liner material, e.g., an oxide or nitride, and then CVD or another like deposition process is used to fill the trench with insulating material. The dielectric may optionally be densified after deposition. A conventional planarization process such as chemical-mechanical polishing (CMP) may optionally be used to provide a planar structure.

FIG. 9(b) depicts forming an isolation region 13 separating the nFET stack 11 and the pFET stack 12, where the nFET stack 11 and the pFET stack 12 are positioned on a bulk-Si substrate 14. In this embodiment, region 18 denotes a mesa (i.e., non-etched) portion of the bulk substrate.

Figure 10A:
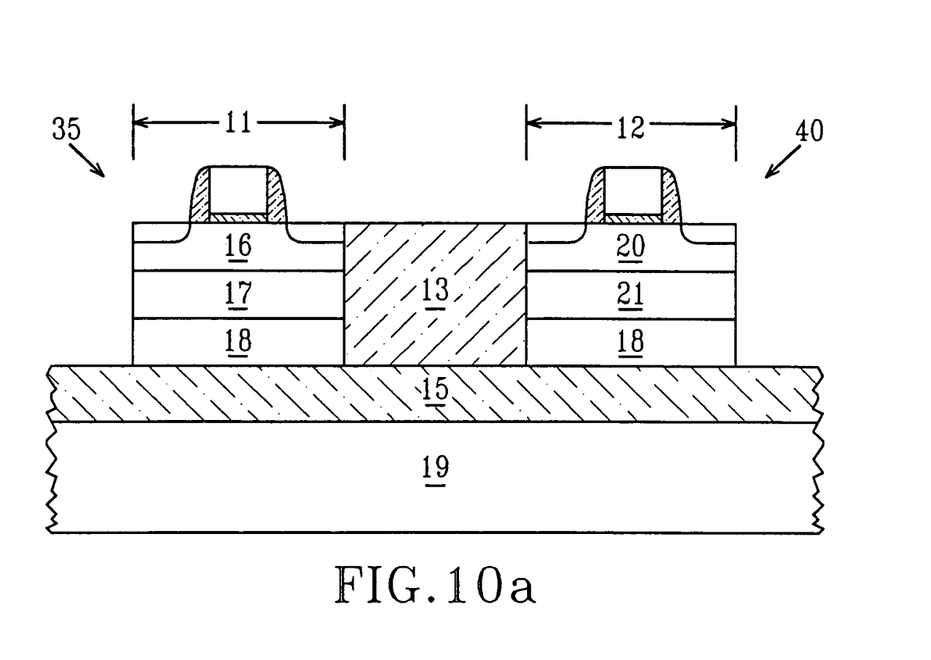
Figure 10B:
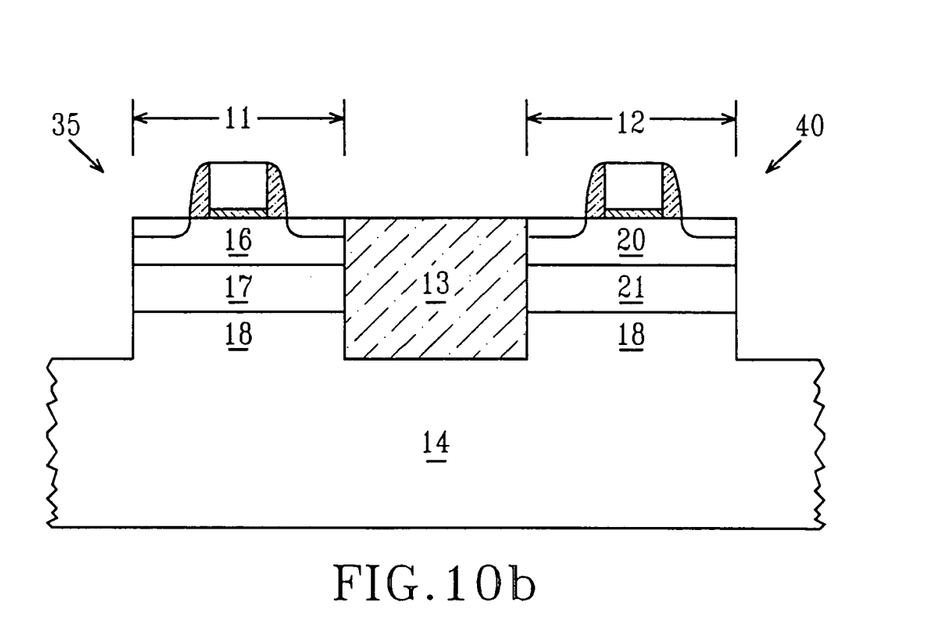

Conventional nFET and pFET forming processes may then be conducted to form at least one nFET device 35 on the nFET stack 11 and at least one pFET device 40 on the pFET stack 12, as depicted in FIGS. 10(a) and 10(b).

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. A semiconducting material comprising:
    a substrate;
    a first layered stack atop said substrate, said first layered stack comprising a first Si-containing portion of said substrate, a compressive layer having a lower surface that is in direct contact with an upper surface of said first Si-containing portion of said substrate, and a first semiconducting layer atop said compressive layer; and
    a second layered stack atop said substrate, said second layered stack comprising a second Si-containing portion of said substrate, a tensile layer having a lower surface that is in direct contact with an upper surface of said second Si-containing portion of said substrate, and a second semiconducting layer atop said tensile layer.

2. The semiconducting substrate of claim 1 wherein said substrate is a silicon-on-insulating substrate or a bulk-silicon substrate.

3. The semiconducting substrate of claim 1 wherein said compressive layer comprises SiGe having Ge present in a concentration ranging from about 5% to about 30% by atomic weight percent.

4. The semiconducting substrate of claim 1 wherein said tensile layer comprises silicon doped with carbon, said carbon is present in a concentration ranging from about 1% to 6% by atomic weight percent.

5. The semiconducting substrate of claim 1 wherein said compressive layer elastically transfers tensile stresses to said first semiconducting layer.

6. The semiconducting substrate of claim 1 wherein said tensile layer elastically transfers compressive stresses to said second semiconducting layer.

7. The semiconducting substrate of claim 1 wherein said compressive layer and said tensile layer have a thickness ranging from about 10 nm to about 100 nm.

8. The semiconducting substrate of claim 1 wherein at least one nFET device is formed atop said first layered stack.

9. The semiconducting device of claim 1 wherein at least one pFET device is formed atop said second layered stack.

10. The semiconductor substrate of claim 1 wherein said first layered stack and said second layered stack are separated by an isolation region.

* * * * *